United States Patent
Sedillo et al.

[19]

[11] Patent Number: 6,053,087
[45] Date of Patent: Apr. 25, 2000

[54] SPOOL RELEASE TOOL

[75] Inventors: Edward Sedillo, Middleton; Javier Guerricabeitia, Boise; Rolanda Mills, Middleton; Gene K. Huffaker, Boise, all of Id.

[73] Assignee: Hewlett-Packard Company, Palo Alto, Calif.

[21] Appl. No.: 09/111,285

[22] Filed: Jul. 6, 1998

[51] Int. Cl.[7] .................................................. B25B 23/00
[52] U.S. Cl. ................................................. 87/461; 7/170
[58] Field of Search ........................... 7/100, 170; 81/461

[56] References Cited

U.S. PATENT DOCUMENTS 4,200,943  5/1980  Fredin et al. ........................... 7/170 X
5,613,412  3/1997  Dawson ................................... 7/100 X

*Primary Examiner*—James G. Smith

[57] ABSTRACT

A spool release tool that includes two tools that may be used separately or together to release a two piece spool of the type that includes a rotary locking and release mechanism. The first, a spool turn handle tool, includes a handle and an adapter on the handle. The adapter is configured to operatively connect the handle to one of the flanges of the spool. The adapter, for example, may be a pair of spaced apart parts that project from the handle to fit into openings on the outer flange of the spool. The second tool, a spool stop, includes a base and an arm. The base is configured to be supported in a stationary position on the fixture. The arm extends away from the base to engage and hold the inner flange.

7 Claims, 5 Drawing Sheets

SPOOL RELEASE TOOL

FIELD OF THE INVENTION

The invention relates generally to the manufacture of printed circuit boards and, more particularly, to a spool release tool that helps separate the flanges of take-up spools used on feeder assemblies for automated part mounting equipment.

BACKGROUND OF THE INVENTION

Computers and printers and many other types of modern electronic equipment often include some type of a printed circuit board assembly. In computers, for example, a printed circuit "motherboard" carries the wiring pattern, electronic parts and the logic and memory integrated circuit chips that control the functions of the computer. In a laser printer, the formatter printed circuit board carries the wiring pattern, electrical parts and integrated circuit chips that control the functions of the printer. During the assembly line manufacture of printed circuit boards, many of the electronic parts, particularly the smaller parts, are mounted on the boards using high speed computer controlled automated machines. These parts are often fed to the mounting machines on a long tape. The tape, which consists of the electronic parts removably affixed to a backing strip, moves from a supply spool, through the mounting machine where the parts are stripped off and installed on the circuit board, to a take-up spool that holds the now empty backing strip.

The spools consist of a center hub sandwiched between two round flat flanges. The tape is wound on the hub (the backing strip only for the take-up spool) between the two flanges. The flanges of the take-up spool are usually contructed as individual pieces that may be separated to expose the hub and make it easier to remove and discard or recycle the backing strip. The two flanges pieces fit together through the mating hub portions that extend out from the inside of each flange. The two pieces are locked together by inserting one hub portion into the other hub portion and then rotating one or both flange pieces clockwise. A slight interference fit between the mating hub portions locks the flange pieces together, that is by screwing them together a fraction of one turn. The flange pieces are released, and may be separated, by rotating the flange pieces counterclockwise, that is, by unscrewing the two hub portions.

The tension on the backing strip as it is wound on to the take-up spool tends to tighten the two flange pieces together. As a result, it is sometimes difficult to release, that is, unscrew and separate the two pieces as necessary to remove and discard the backing strip.

SUMMARY OF THE INVENTION

Accordingly, the present invention is directed to a tool that may be used to release even tightly locked flanges. The spool release tool of the present invention includes two tools that may be used separately or together, as may be necessary or desirable, to release the flanges. The first, a spool turn handle tool, includes a handle and an adapter on the handle. The adapter is configured to operatively connect the handle to one of the flanges of the spool. The adapter, for example, may be a pair of spaced apart parts that project from the handle to fit into openings on the outer flange of the spool. The projecting parts are inserted into the openings to unscrew and release the outer flange.

The second tool, a spool stop, includes a base and an arm. The base is configured to be supported in a stationary position on the fixture. The arm extends away from the base to engage and hold the inner flange. The tools are, preferably, used together. The spool stop is installed on the fixture that mounts the spool. Then, the spool turn handle is used to turn the outer flange. As the spool turns, the spool stop engages the inner flange of the spool to prevent the inner flange from turning. In this way, the outer flange can be easily unscrewed and released to expose the hub.

DESCRIPTION OF THE DRAWINGS

Like parts are referred to by like reference numbers in all Figures.

DETAILED DESCRIPTION OF THE INVENTION

Figure 1:
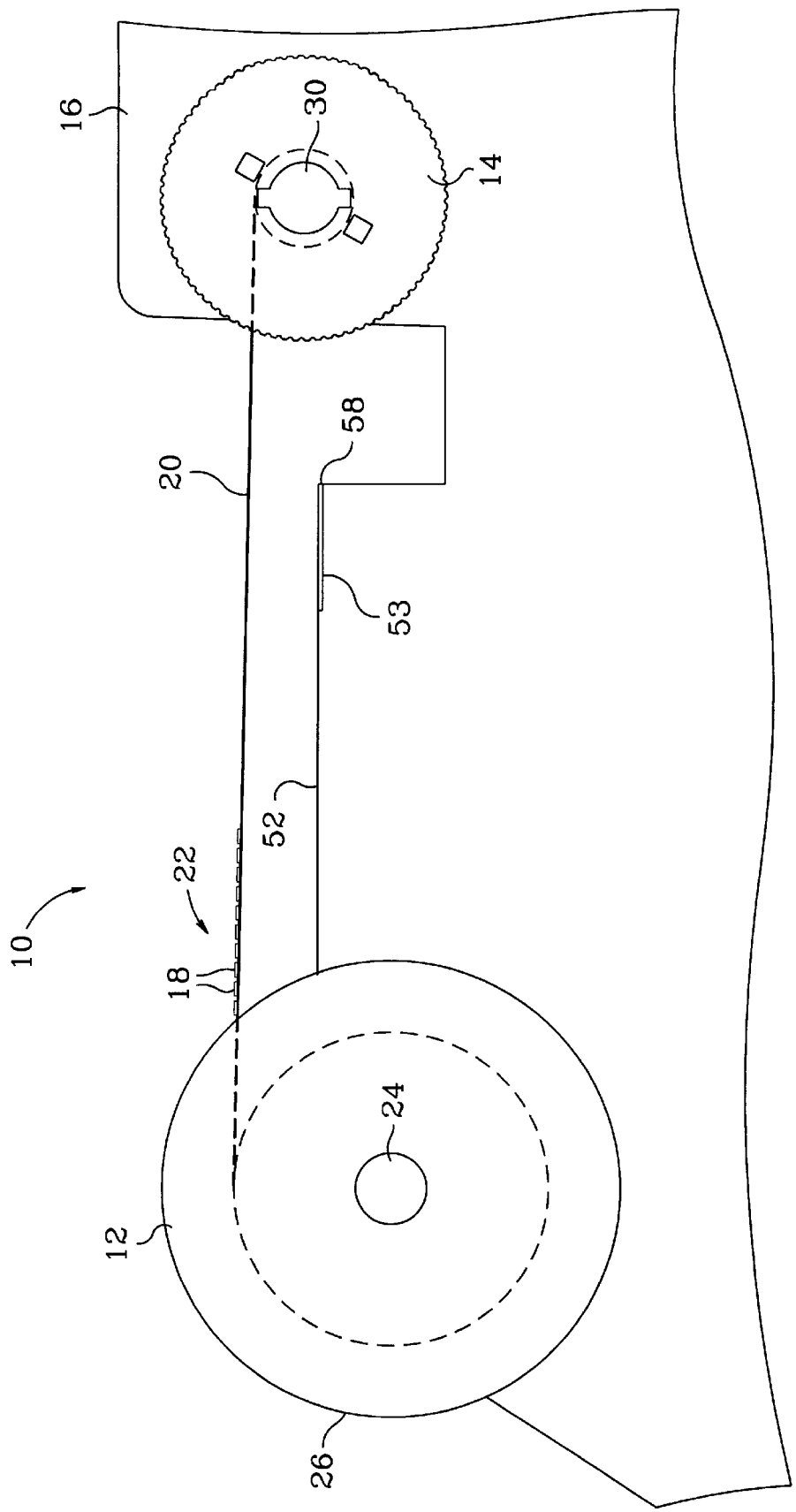
FIG. 1 is a partial elevation side view of a spool feeder assembly showing the supply and take-up spools mounted on the flat metal fixture.

FIG. 1 illustrates a feeder assembly, designated generally by reference number 10, typical of those used in automated printed circuit board part mounting machines (not shown), such as a Fuji brand, model CP6 placement machine. Feeder 10 includes a supply spool 12 and a take-up spool 14 mounted on a generally flat metal fixture 16. A series of electronic parts 18 are mounted on a backing strip 20 to form a part supply tape 22. Parts 18 may include, for example, resistors, diodes, transistors or even small integrated circuit chips.

Feeder 10 is a modular component that is easily installed into and removed from the mounting machines. Each mounting machine may use a variety of different feeders 10 fitted with tapes 22 carrying the desired type and configuration of parts 18 for a particular printed circuit board. Feeders 10 are stored in a storage bay in the assembly line work area. The storage bay is usually located near the mounting machine so that the feeders 10 are readily available to the machine operators.

Figure 2:
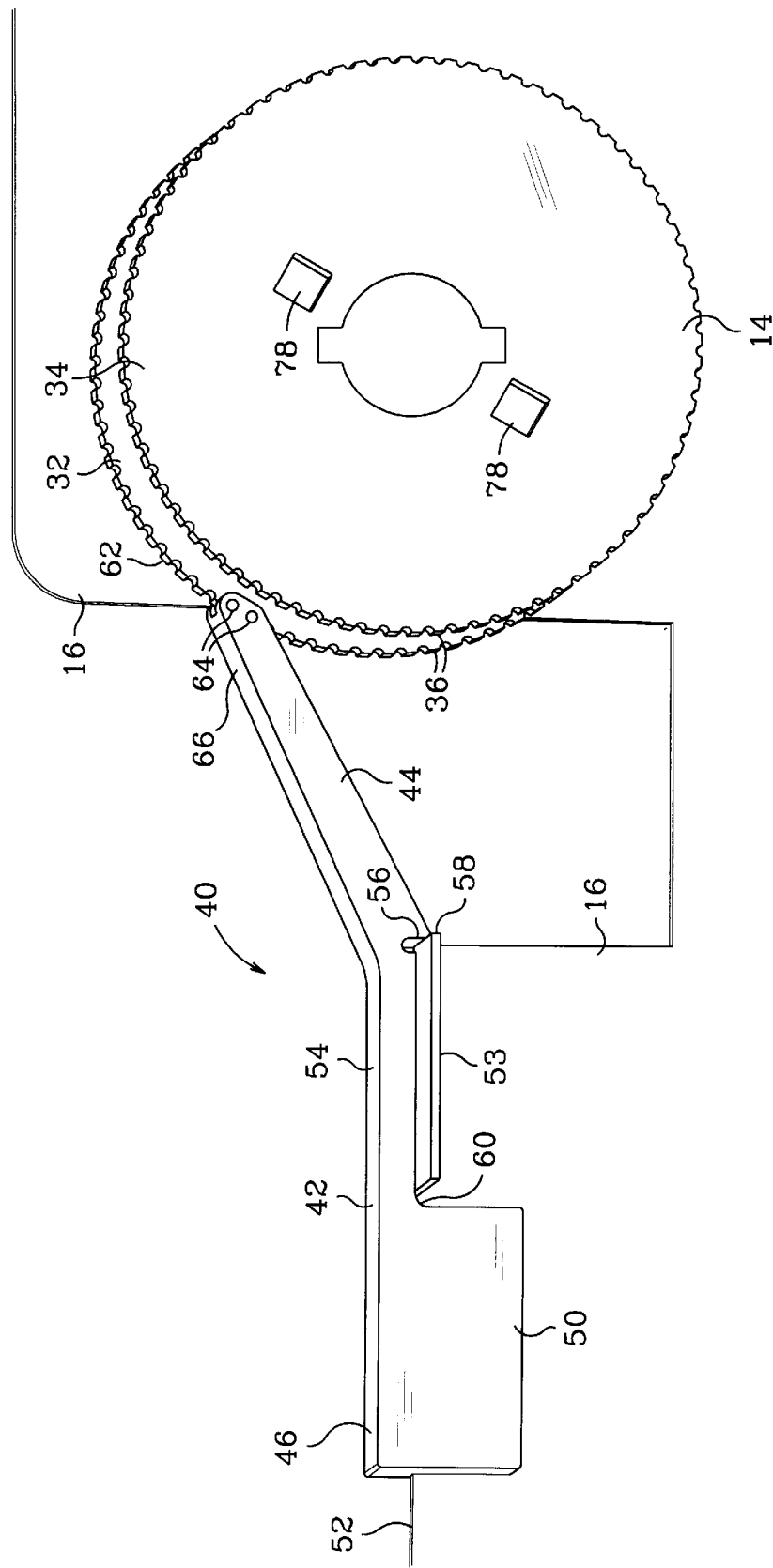
FIG. 2 is a perspective view showing one embodiment of the invented spool stop tool installed on the feeder fixture.

Supply spool 12 consists of a center hub 24 sandwiched between two round flat flanges 26. Tape 22 is wound on hub 24 between flanges 26. As best seen in FIG. 2, take-up spool 14 consists of a center hub 30 sandwiched between an inner flange 32 and an outer flange 34. A series of teeth 36 are formed around the outside edge of each flange 32 and 34. Backing strip 20 is wound on hub 30 between flanges 32 and 34. Flanges 32 and 34 of take-up spool 14 are contructed as individual pieces that may be separated to expose hub 30. The separable spool makes it easier to remove and discard or recycle backing strip 20. The two flanges 32 and 34 fit together, for example, through mating hub pieces (not shown) that extend out from the inside of each flange. The individual flanges 32 and 34 are locked together by inserting one hub piece into the other hub piece and then rotating one or both flanges clockwise (that is, by screwing the hub pieces together).

A slight interference fit between the mating hub pieces locks the flanges 32, 34 together. The flanges 32, 34 are released, and may be separated, by rotating them counterclockwise (that is, by unscrewing the two hub pieces). The tension on backing strip 20 as it is wound on to take-up spool 14 tends to tighten the two hub pieces together. As a result, it is sometimes difficult to manually release, that is, unscrew the hub pieces by hand and separate flanges 32 and 34 as necessary to remove and discard backing strip 20. The process of unscrewing hub 30 and separating inner and outer flanges 32 and 34 is sometimes referred to for convenience simply as "releasing" take-up spool 14.

Figure 3:
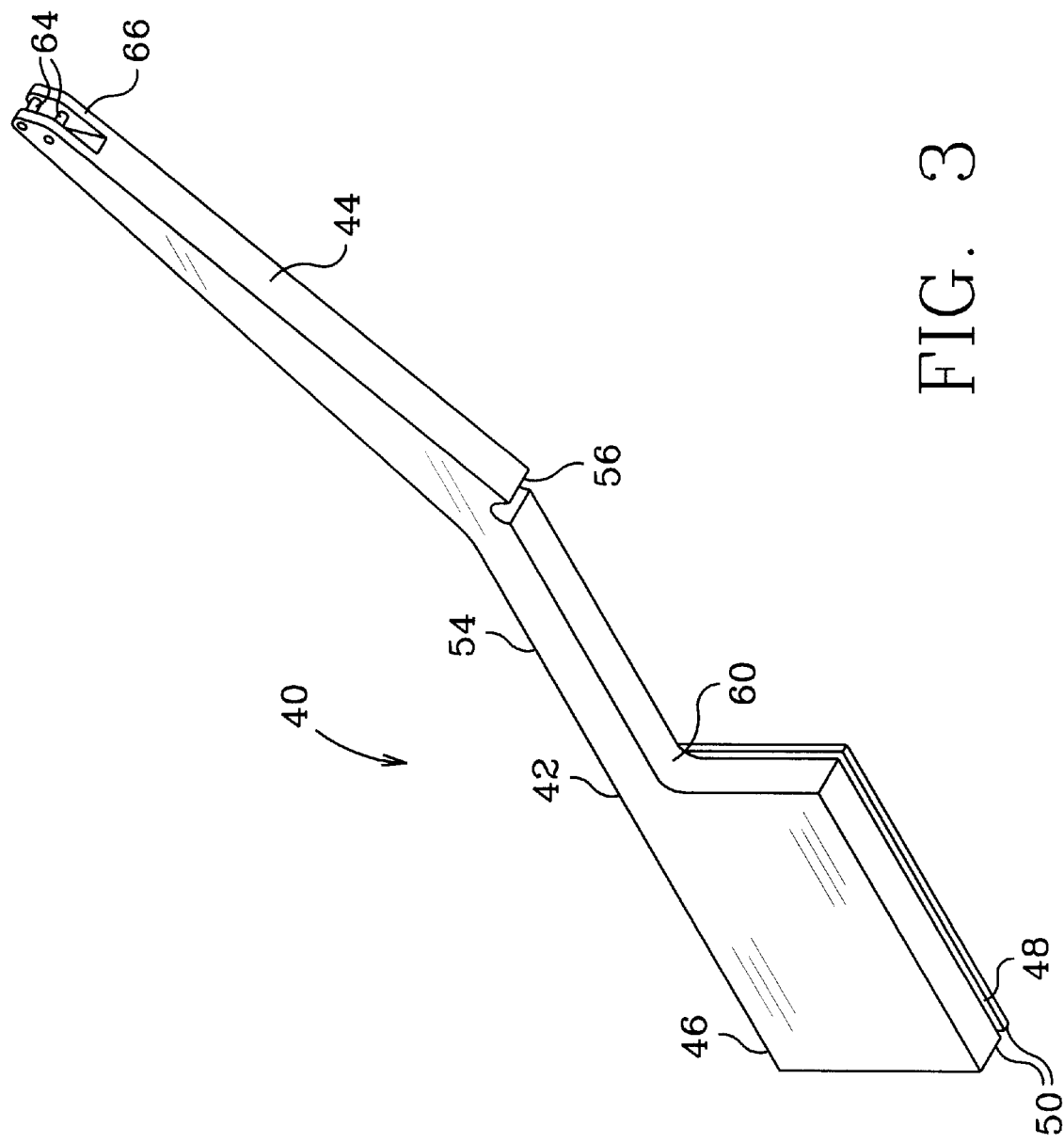
FIG. 3 is a perspective view of the spool stop tool of FIG. 2.

In FIG. 2, spool stop tool 40 is shown installed on fixture 16 of feeder 10 to help release hub 30 and separate inner and outer flanges 32 and 34. Fixture 16 may be clamped in a vice to stabilize feeder 10 and facilitate the release of take-up spool 14. FIG. 3 is a more detailed view of spool stop 40. Referring to FIGS. 2 and 3, spool stop tool 40 includes a base 42 and an arm 44. Base 42 is sized and shaped to fit along the top part of fixture 16 adjacent to take-up spool 14. The rear portion 46 of base 42 includes a channel 48 defined by opposing sidewalls 50. The top edge 52 of fixture 16 slides into channel 48 when spool stop 40 is installed on feeder 10. Thus, the top edge 52 supports the rear portion 46 of base 42 and sidewalls 50 prevent spool stop 40 from moving side to side on fixture 16.

A flat tab 53 formed along the top edge of fixture 16 supports the forward portion 56 of base 42. Tab 53 is a common feature on many conventional feeder fixtures. A lip 56 is cut into the extreme front of forward portion 54 at the location of the front edge 58 of tab 53. The distance between the corner 60 (formed at the junction of sidewalls 50 and forward portion 54) and lip 56 is made just slightly greater than the length of tab 53. In this way, when spool stop 40 is installed on feeder 10, corner 60 and lip 56 prevent spool stop 40 from moving front to back along fixture 16.

Arm 44 of spool stop 40 extends from base 42 up to outer edge 62 on inner flange 32 of take-up spool 14. A pair of pins 64 positioned in the end 66 of arm 44 engage teeth 36 of inner flange 32. As outer flange 34 is rotated counter-clockwise to unscrew hub 30 and separate flanges 32 and 34, pins 64 engage teeth 36 on inner flange 32 so that spool stop 40 blocks the counter-clockwise rotation of inner flange 34. The outer flange 34 continues to rotate to unscrew hub 30 and separate the outer flange 34 from the inner flange 32. It is desirable to extend arm 44 at an upward angle to flange 32 to minimize any clockwise moment on spool stop 40 at lip 56.

Figure 4:
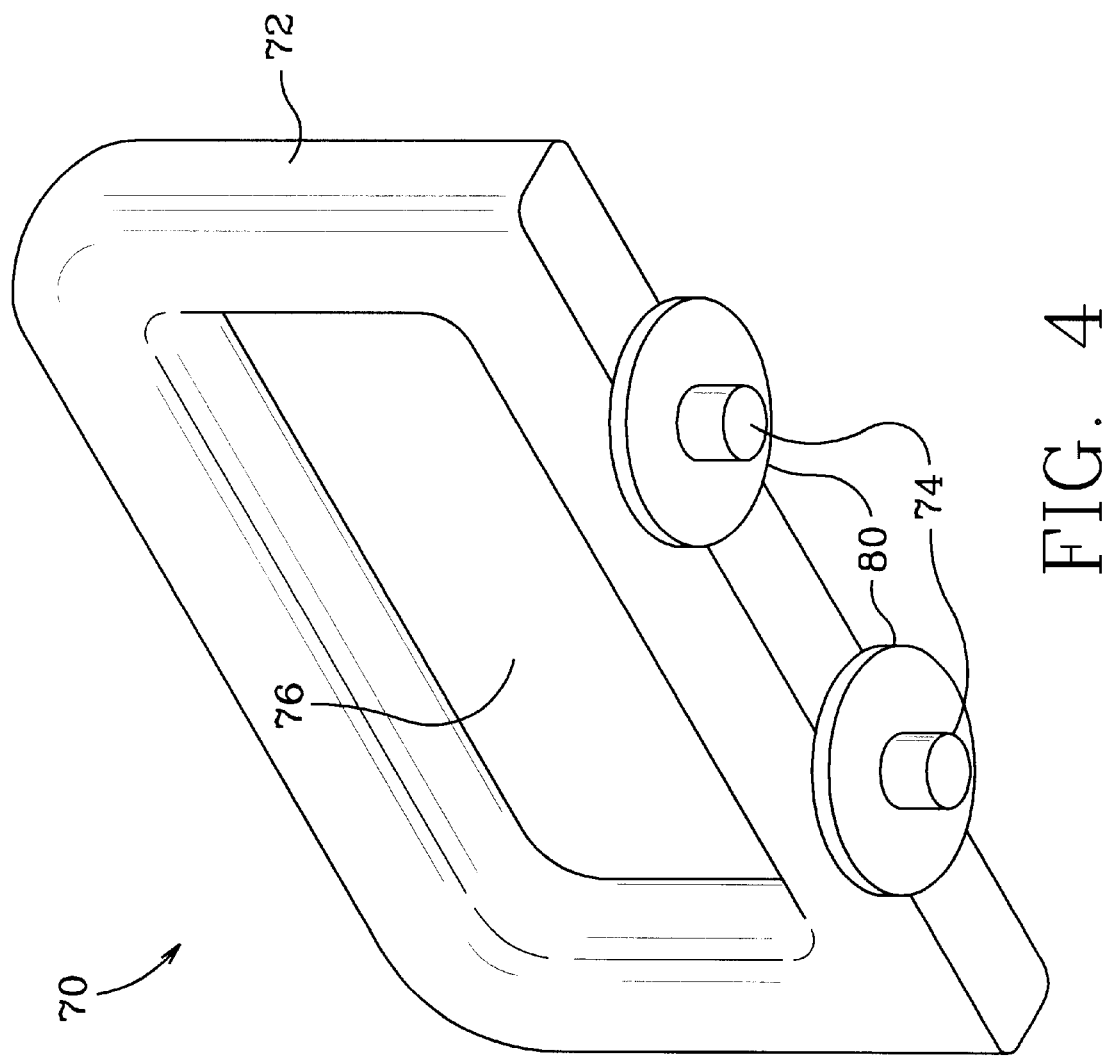
FIG. 4 is a perspective view of one embodiment of the invented spool turn handle.
Figure 5:
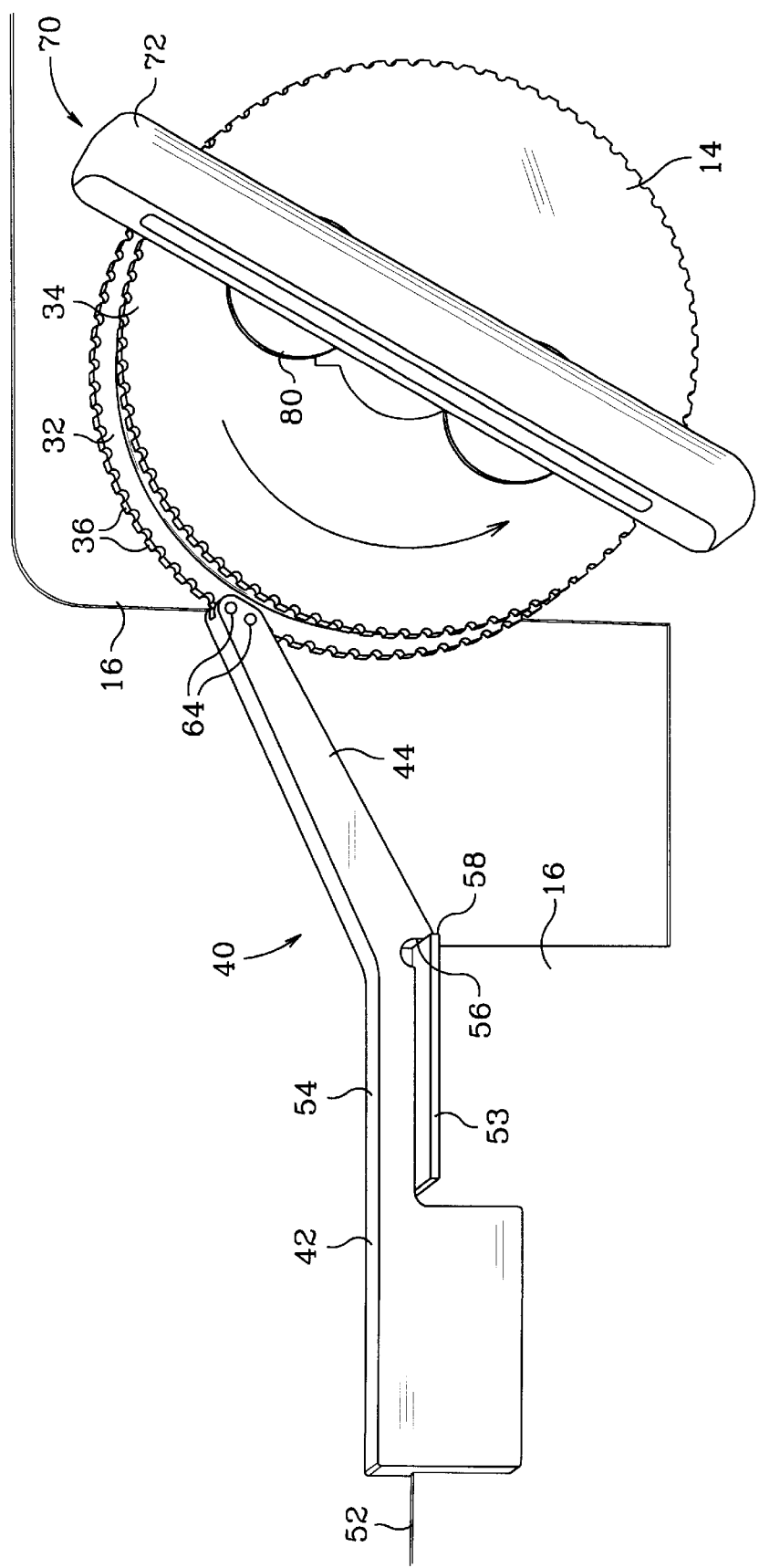
FIG. 5 is a perspective view showing the spool stop and handle tools installed on the feeder assembly.

Spool stop 40 will usually be used together with a spool turn handle 70, as shown in FIG. 5. The construction and operation of spool turn handle 70 is shown in FIGS. 4 and 5. Referring to FIGS. 4 and 5, spool turn handle 70 includes a handle 72 and adapters 74 that protrude from handle 72. Adapters 74 are configured to provide the operative connection between turn handle 70 and take-up spool 14. In the embodiment shown in the drawings, adapters 74 are depicted as round pins sized and shaped to fit into openings 78 (seen in FIG. 2) in outer flange 34 of take-up spool 14. Other configurations for adapters 74 may be necessary or desirable depending on the configuration of take-up spool 14. For example, it may be desirable to construct adapters 74 as receptacles that fit over bosses or other protrusions from outer flange 34. Although handle 72 is depicted as a generally D-shaped part with a center opening 76, any shape that is easy to grasp and turn, with or without a center opening, may be used. Flat washers 80 may be used, as shown, to help ensure that adapters 74 fit properly into openings 78 in take-up spool 14.

The operation of spool stop tool 40 and spool turn handle 70 to unscrew and separate the inner and outer flanges of take-up spool 14 will now be scribed with reference to FIG. 5. Once the feed assembly 10 is removed from the mounting machine and, preferably, clamped in a vice, spool stop 40 is laid top edge 52 of fixture 16 so that it "locks in" over tab 52. At least on of the pins 64 engage teeth 36 on the inner flange 32 of take-up spool 14 to block any counter-clockwise rotation of inner flange 32. Then, adapters 74 on turn handle 70 are inserted into openings 78 (seen in FIG. 2) on take-up spool 14 and handle 70 is turned to unscrew and separate inner and outer flanges 32 and 34. Tools 40 and 70 are removed, and the inner flange 34 re-installed by hand pressure.

Although the invention has been shown and described with reference to the foregoing exemplary embodiments, alternative embodiments may be made. Therefore, it is to be understood that these and other embodiments may be made without departing from the spirit and scope of the invention as defined in following claims.

What is claimed is:

1. A tool kit for releasing a two piece spool of the type that includes a rotary locking and release mechanism so that the flanges of the spool are separated by turning one flange relative to the other flange, the spool mounted to a fixture in a tape feeder assembly such as those used in automated mounting machines for manufacturing printed circuit boards, the tool kit comprising:

a spool release tool having a handle and an adapter on the handle, the adapter configured to operatively connect the handle to one of the flanges of the spool; and a spool stop tool having a base and an arm, the base configured to be supported in a stationary position on the fixture and the arm extending from the base, the arm configured to engage the flange.

2. The tool kit according to claim 1, wherein the adapter comprises a part projecting from the handle, the projecting part configured to fit into an opening in the flange.

3. The tool kit according to claim 1, wherein the adapter comprises a pair of spaced apart parts projecting from the handle, the projecting parts configured to fit into openings in the flange.

4. The tool kit according to claim 1, wherein the handle comprises a D shaped generally planar part having an opening in the center thereof.

5. A tool kit according to claim 1, further comprising a pin mounted to the end of the arm to engage teeth on the perimeter of the flange, the pin oriented horizontally along a line perpendicular to a radius of the flange.

6. A tool kit according to claim 1, wherein the base comprises a rear portion having spaced apart opposing sidewalls that define a vertically oriented channel, the channel having a width slightly greater than the thickness of the fixture so that the fixture can slide into the channel and prevent the spool stop from moving side to side on the fixture.

7. A tool kit according to claim 6, wherein the base further comprises:

a forward portion positioned between the rear portion and the arm, the forward portion having a lower surface that rests on the fixture when the tool is installed on the fixture;

a corner defined by a junction of the sidewalls of the rear portion and the lower surface of the forward portion; and a lip formed at the front of the lower surface of the forward portion of the base, the distance between the corner and the lip being slightly greater than the length of a tab on the fixture so that, when the spool stop is installed on the fixture, the corner and the lip prevent the spool stop from moving front to back on the fixture.

* * * * *